United States Patent
Goyal et al.

(10) Patent No.: US 11,740,146 B2
(45) Date of Patent: Aug. 29, 2023

(54) SENSOR TO DETECT A MECHANICAL STRESS ON THE BATTERY PACK

(71) Applicant: Hilti Aktiengesellschaft, Schaan (LI)

(72) Inventors: Varnim Goyal, Kaufering (DE); Bernd Ziegler, Schwabmuenchen (DE)

(73) Assignee: Hilti Aktiengesellschaft, Schaan (LI)

( * ) Notice: Subject to any disclaimer, the term of this patent is extended or adjusted under 35 U.S.C. 154(b) by 2 days.

(21) Appl. No.: 17/619,419

(22) PCT Filed: Jun. 17, 2020

(86) PCT No.: PCT/EP2020/066681
§ 371 (c)(1),
(2) Date: Dec. 15, 2021

(87) PCT Pub. No.: WO2020/260079
PCT Pub. Date: Dec. 30, 2020

(65) Prior Publication Data
US 2022/0260440 A1    Aug. 18, 2022

(30) Foreign Application Priority Data

Jun. 25, 2019 (EP) ..................................... 19182262

(51) Int. Cl.
*G01L 5/00* (2006.01)
*G01R 31/385* (2019.01)
(Continued)

(52) U.S. Cl.
CPC .............. *G01L 5/0052* (2013.01); *B25F 5/00* (2013.01); *G01L 1/16* (2013.01); *G01P 15/001* (2013.01); *G01P 15/18* (2013.01); *G01R 31/385* (2019.01)

(58) Field of Classification Search
CPC ...... G01P 15/08; G01P 15/001; G01L 5/0052; G01L 1/16
See application file for complete search history.

(56) References Cited

U.S. PATENT DOCUMENTS

2008/0084180 A1  4/2008  Hasegawa et al.
2012/0242144 A1  9/2012  Chorian et al.
(Continued)

FOREIGN PATENT DOCUMENTS

DE  102012017190 A1  3/2014
DE  102013201345 A1  7/2014
(Continued)

OTHER PUBLICATIONS

International Search Report of PCT/EP2020/066613, dated Sep. 18, 2020.
(Continued)

*Primary Examiner* — Helen C Kwok
(74) *Attorney, Agent, or Firm* — Davidson, Davidson & Kappel, LLC

(57) ABSTRACT

A method for controlling a system including a power-tool and a battery having energy storage cells, wherein the system includes an acceleration sensor, a piezoelectric sensor, a controlling device, signal transmitter and a device for measuring a voltage. Method includes the steps:
- Determining vibration values;
- Determining that the system is free-falling;
- Determining an impact of the system by detecting an acceleration value in the X, Y and Z direction exceeding a first predetermined threshold value; and
- Determine a traveling distance between detecting an acceleration value in the X, Y and Z direction being equal to a predetermined range and detecting an acceleration value in the X, Y and Z direction exceeding the first predetermined threshold value.

A system for carrying out the method is also provided.

6 Claims, 4 Drawing Sheets

(51) Int. Cl.
   *B25F 5/00* (2006.01)
   *G01L 1/16* (2006.01)
   *G01P 15/00* (2006.01)
   *G01P 15/18* (2013.01)

(56) References Cited

U.S. PATENT DOCUMENTS

| | | |
|---|---|---|
| 2012/0279742 A1 | 11/2012 | Roser et al. |
| 2014/0062410 A1 | 3/2014 | Schaefer et al. |
| 2017/0276572 A1 | 9/2017 | Chen et al. |
| 2018/0026312 A1 | 1/2018 | Hinterberger et al. |
| 2018/0054502 A1 | 2/2018 | Wilson et al. |
| 2018/0183120 A1 | 6/2018 | Chan et al. |
| 2020/0044209 A1* | 2/2020 | Huggins ............. H01M 10/425 |
| 2020/0153225 A1* | 5/2020 | Kralik ................. G01P 15/0891 |
| 2020/0313453 A1* | 10/2020 | Huggins ............. H02J 7/00045 |
| 2021/0123737 A1* | 4/2021 | Vetter ..................... G07C 3/00 |
| 2022/0084388 A1* | 3/2022 | Schmidt .............. G01P 15/0891 |
| 2022/0239139 A1* | 7/2022 | Goyal ............... H02J 7/007188 |

FOREIGN PATENT DOCUMENTS

| | | |
|---|---|---|
| EP | 0345655 A2 | 12/1989 |
| EP | 3200313 A1 | 8/2017 |
| EP | 3223202 A1 | 9/2017 |
| WO | WO2020/260068 A1 | 12/2020 |
| WO | WO2020/260079 A1 | 12/2020 |
| WO | WO2020260069 A1 | 12/2020 |

OTHER PUBLICATIONS

International Search Report of PCT/EP2020/066681, dated Sep. 18, 2020.
International Search Report of PCT/EP2020/066606, dated Aug. 25, 2020.

* cited by examiner

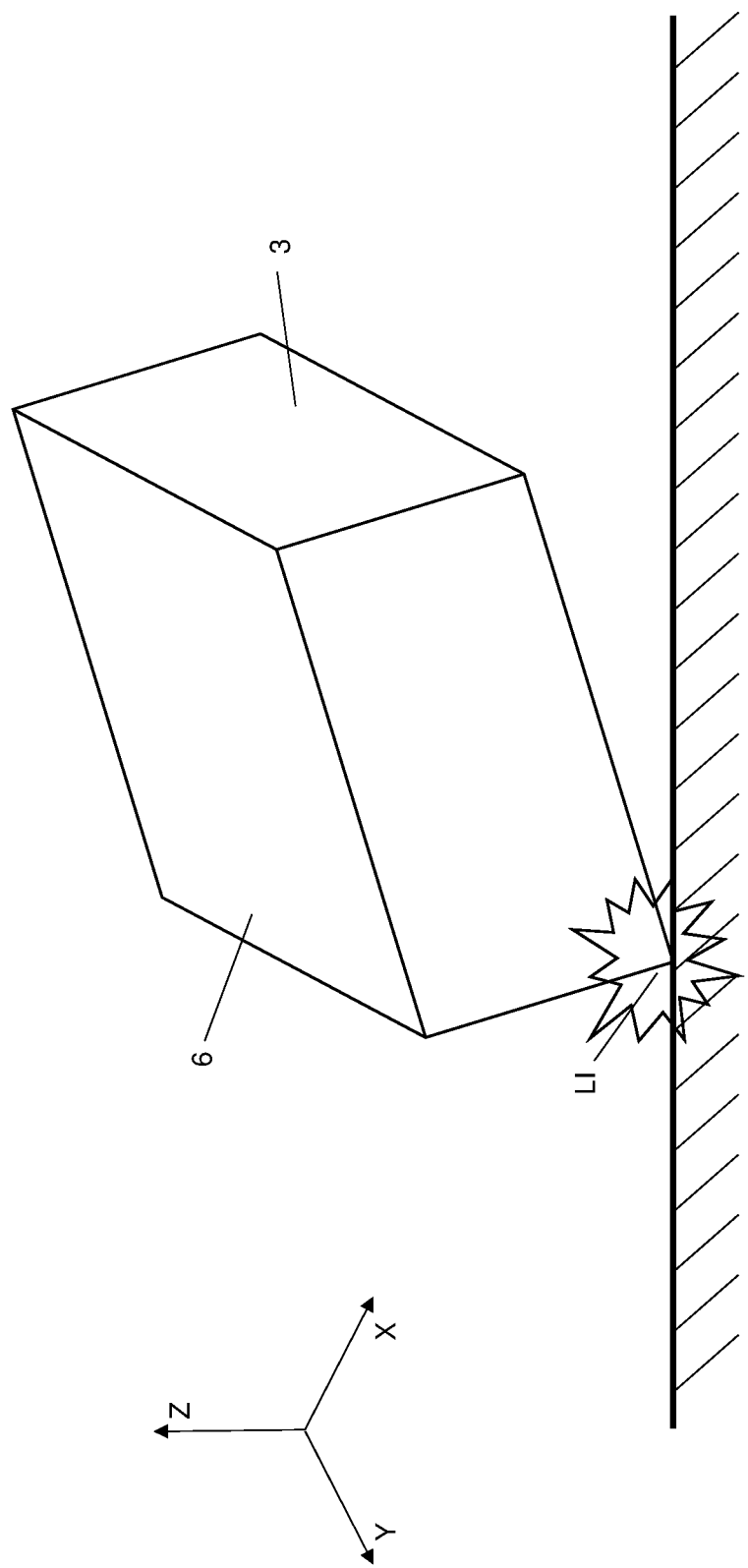

SENSOR TO DETECT A MECHANICAL STRESS ON THE BATTERY PACK

SUMMARY OF THE INVENTION

The present invention relates to a method for controlling a system comprising a power-tool and at least one battery having at least one energy storage cell, wherein the system comprises at least one acceleration sensor for detecting at least one acceleration value in an X, Y and Z direction, at least one piezoelectric sensor, a controlling device, signal transmitter as well as a device for measuring a voltage.

The invention also relates to a system comprising at least one battery having at least one energy storage cell and a power-tool.

In particular, the present invention relates to a system comprising a handheld power tool combinable with a battery having at least one rechargeable battery cell. The handheld power tool can be in shape of a cordless screwdriver, circular saw, jigsaw, reciprocating saw, cordless drill or the like.

On a building site when operating a system comprising a power tool powered by a battery it is not unusual to unintentionally dropping the system from a certain height onto the ground. Additionally, it is not uncommon to intentionally throwing the system a certain distance also resulting in dropping onto the ground.

Modern power tools as well as batteries are very robust and can withstand a relative high amount of abuse, rough handling as well as almost any kinds of mechanical stress and strain. Dropping and falling even relative high distances to a hard and inelastic ground do not harm the power tool and/or battery. Beyond that, power tools are usually able to withstand a wide range and relative high amounts of vibration before failing. Also, shocks other than those resulting from dropping the power tool are normally no bigger problems for modern power tools. It has been observed that power tools and even battery packs have been misused as hammers to drive nails into objects. Even though using a modern power tool and/or battery pack as a hammer can be considered a relative high level of abuse, most modern power tools and battery packs are moderately able to withstand being used as a hammer.

However, it is still possible that the system comprising the power tool and battery is getting damaged after being subject to mechanical stress and/or strain. In the case of a damaged power tool and/or battery continuing operating the system could be potentially dangerous for a user. In that context, it is difficult for a user of the system to tell if an abuse, in particular, a drop harmed the system, or not.

It is an object of the present invention to provide a method for controlling a system comprising a power-tool and at least one battery having at least one energy storage cell as well as a system comprising a power-tool and at least one battery having at least one energy storage cell, in order to increase the safety for a user of the system after being exposed to mechanical stress and/or strain.

According to the present invention, there is provided a method for controlling a system comprising a power-tool and at least one battery having at least one energy storage cell, wherein the system comprises at least one acceleration sensor for detecting at least one acceleration value in an X, Y and Z direction, at least one piezoelectric sensor, a controlling device, signal transmitter as well as a device for measuring a voltage.

Additionally, the method comprises the steps of

Determining vibration values acting upon the system by detecting accelerations values within a predetermined range;

Determining that the system is free-falling by detecting an acceleration value in the X, Y and Z direction being equal to a predetermined range;

Determining an impact of the system by detecting at least one acceleration value in the X, Y and Z direction exceeding a first predetermined threshold value;

Determine a traveling distance between detecting an acceleration value in the X, Y and Z direction being equal to zero and detecting at least one acceleration value in the X, Y and Z direction exceeding a predetermined threshold value;

Determining a shock value by means of the at least one piezoelectric sensor or the at least one acceleration sensor;

Detecting a first and second voltage value of the at least one energy storage cell by means of the device for measuring a voltage; and Sending out a first signal by means of the signal transmitter if the accelerations values within a given range for determining vibrations exceed a first predetermined threshold value for a first predetermined time period, the determined drop height exceeds a first predetermined threshold, the detected acceleration value for determining a shock exceeds a predetermined first threshold value, the detected force value exceeds a predetermined threshold value or a difference value between the first and second voltage value exceeds a first predetermined threshold value.

In a further preferred embodiment, the method can comprise the step of sending out a second signal by means of the signal transmitter if the accelerations values within a given range for determining vibrations exceed a second predetermined threshold value for a second predetermined time period, the determined drop height exceeds a second predetermined threshold, the detected acceleration value for determining a shock exceeds a predetermined second threshold value or a difference value between the first and second voltage value exceeds a second predetermined threshold value.

Beyond that, in an additional preferred embodiment, the method can comprise the step of sending out a third signal by means of the signal transmitter if in a predetermined time period the number of times, in which the at least one acceleration value exceeds the predetermined threshold value, exceeds a predetermined quantity.

Furthermore, in yet another preferred embodiment, the method can comprise the step of sending out a fourth signal by means of the signal transmitter, if the occurrence of an event in which at least one acceleration value exceeds the first predetermined threshold value, exceeds a predetermined quantity during a predetermined time period.

The inventive system is able to perform and carry out the inventive method.

The inventive system provides the same advantages as the inventive method.

According to the present invention, there is also provided a system comprising a power-tool and at least one battery having at least one energy storage cell.

Additionally, the system comprises at least one acceleration sensor for detecting at least one acceleration value in an X, Y and Z direction, a controlling device, a signal transmitter, an interface for an exchange of data between the at least one battery, at least one piezoelectric sensor and the power tool as well as a device for measuring a voltage.

According to an advantageous embodiment of the present invention it could be possible that the system comprises at least one temperature sensor for measuring a temperature inside battery.

Further advantages and preferred embodiments will be described in the following together with the drawings listed below. The expressions "left", "right", "below" and "above" used in the following description, are referred to the drawings in an alignment such that the reference numbers and the notation of the Figures used can be read in normal.

BRIEF DESCRIPTION OF THE DRAWINGS

In the drawings:

FIG. 4 the battery in a certain orientation at the moment of impact onto a solid ground.

DETAILED DESCRIPTION

Example

Figure 1:
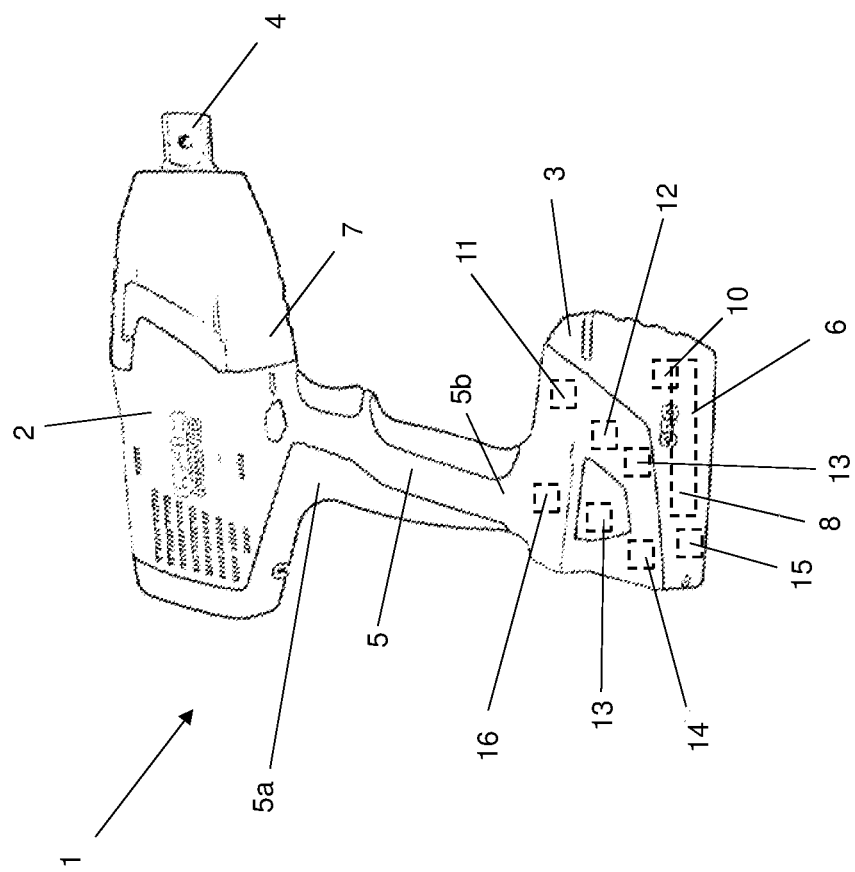
FIG. 1 a side-view of a hand-held power tool with a battery, a piezoelectric sensor, device for measuring voltage, an acceleration sensor, a temperature sensor as well as a signal transmitter.
Figure 2:
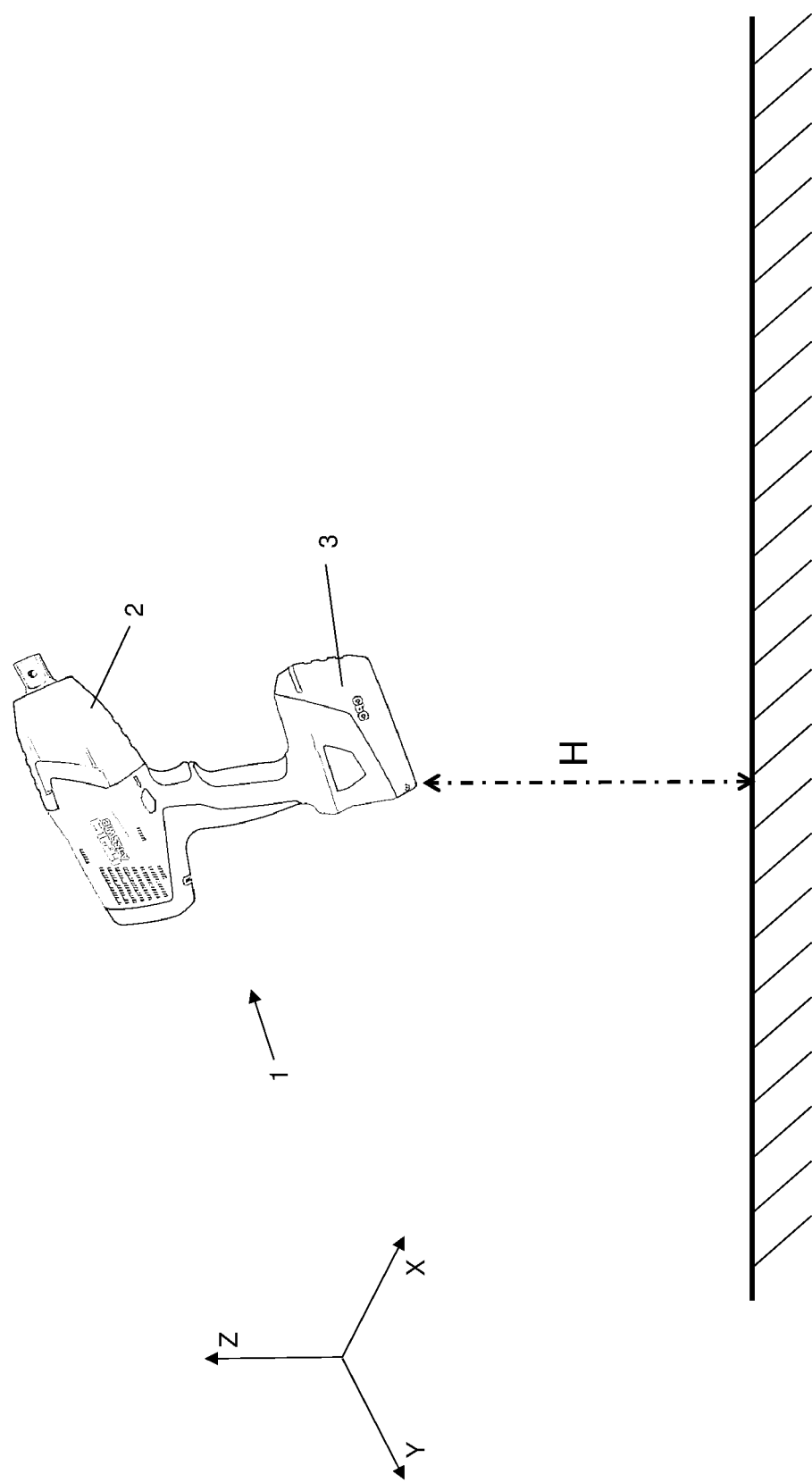
FIG. 2 the hand-held power tool at a certain height above a solid ground.
Figure 3:
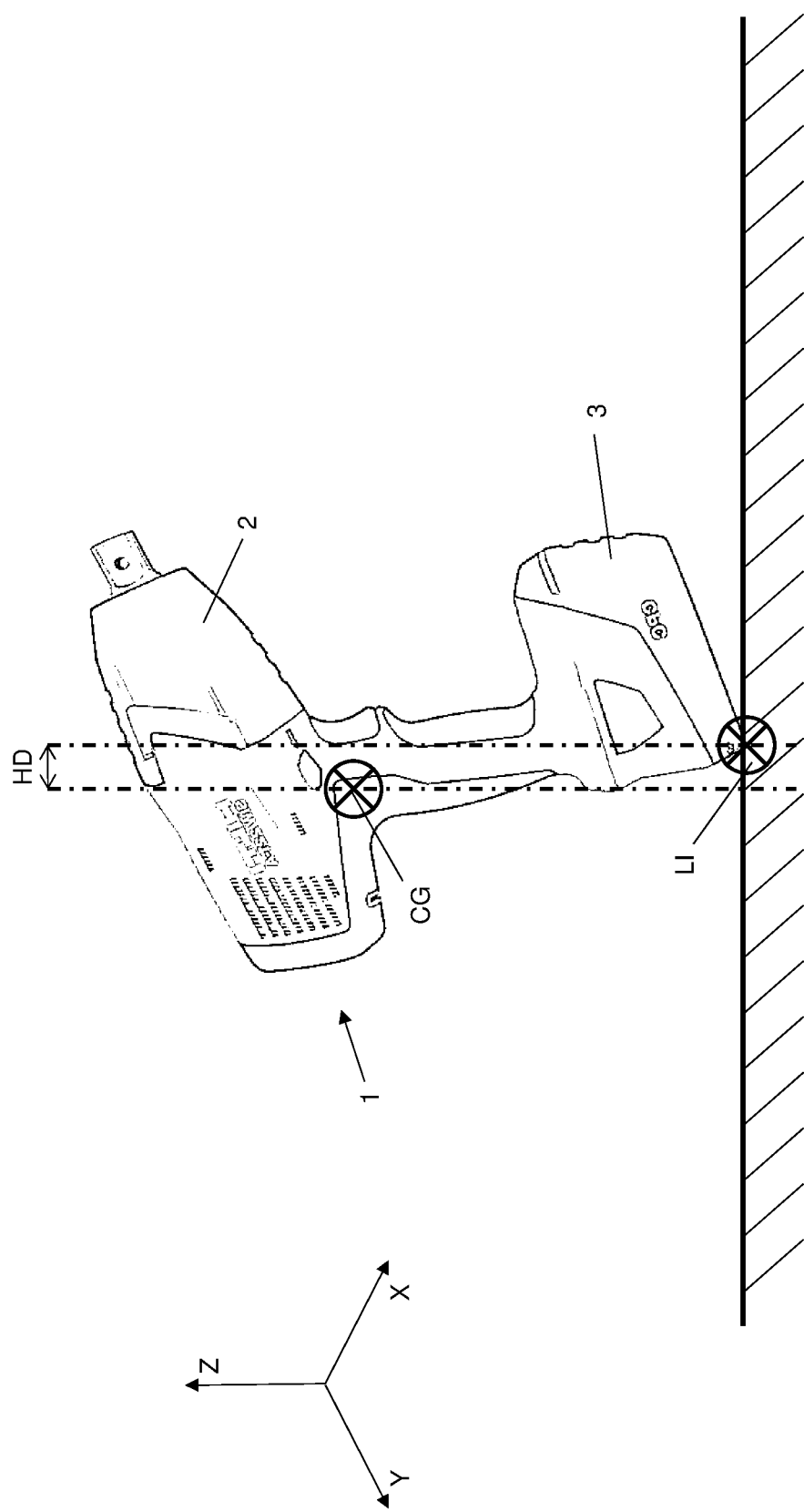
FIG. 3 the hand-held power tool at the moment of impact onto a solid ground.

FIG. 1 shows a system 1 comprising a handheld power tool 2 as well as a battery 3. The battery 3 is removable attached to the power tool 2, in order to supply electrical energy to the power tool 2. Within the example shown, the power tool 2 is in form of a cordless screw driver. It is however possible that the power tool 2 is in form of a cordless saw, grinder, drill or the like. According to an alternative embodiment, the power tool is a rig-mounted power tool.

The handheld power tool 2 embodied as a cordless screw driver comprises essentially a housing 7, an electric motor, a gear box, a tool holding device 4 and a handle 5. The handle 5 comprises an upper end 5a and lower end 5b, whereby the battery 3 is removable attached to the lower end 5b of the handle 5.

A drive shaft of the electric motor is connected via the gear box to the tool holding device 4, in order to eventually transfer a torque produced by the electric motor to a tool (e.g. a bit) held by the tool holding device 4. The electric motor, the drive shaft as well as the gear box are not illustrated in the figures.

The battery 3 comprises a housing 6, in which several energy storage cells 8 for storing and releasing electrical energy are positioned. The energy storage cells 8 can also be termed battery cells or cells. In addition to that, the battery 3 also comprises a controlling device 9 for controlling and regulating all processes within the battery 3. The controlling device 9 can also be termed central processing unit (CPU), battery management system, battery management device, central processor or main processor. Also, the controlling device 9 comprises a memory (i.e. storage element) and a clock (or stop watch) for measuring and recording time, time periods and time intervals.

In addition to that an acceleration sensor 10 is positioned within a housing 6 of the battery 3. The acceleration sensor 10 can be in form of an accelerometer. It is, however, also possible that an additional accelerometer or a single accelerometer is positioned within a housing 7 of the power tool 2. FIG. 1 illustrates a system with an accelerometer within the housing 6 of the battery 3.

The acceleration sensor 10 or accelerometer serves to record and measure accelerations, i.e. acceleration values, effecting the system and, in particular, the battery 3. The accelerometer 10 used within the inventive system 1 is formed to record and measure G-forces (i.e. gravitational forces: 1 g equals to 9,81 m/s$^2$) and in particular the gravitational forces and the ground reaction forces. The accelerometer 10 is configured to record and measure acceleration values in a X-Y and Z-direction of the system 1. The X-Y and Z-direction can also be understood as X-Y and Z-axes. Also, the acceleration sensor 10 is able to detect, measure and record vibrations occurring to the system 1. Beyond that, the accelerometer 10 is connected to the controlling device 9, in order to transfer and receive signals and data.

Furthermore, the system 1 also comprises a device for measuring a voltage 11 of the energy storage cells 8. The device for measuring a voltage 11 is positioned within the housing 6 of the battery 3. The device for measuring a voltage 11 can also be termed voltmeter. According to an alternative embodiment of the present invention, the device for measuring a voltage 11 or an additional device for measuring a voltage can be positioned within the housing 7 of the power tool 2. In one example, the device for measuring a voltage 11 can be in form of a voltmeter. The device for measuring a voltage 11 is configured to measure the voltage of the energy storage cells 8 in regular or irregular time intervals.

Beyond that, the device for measuring a voltage 11 is connected to the controlling device 9, in order to transfer and receive signals and data.

Additionally, the system 1 also comprises a device for discharging the energy storage cell 12, which serves to discharge or drain an electrical charge from each energy storage cell 8. The device for discharging the energy storage cell 12 can also be termed discharging device and can be in form of one or more resistors or capacitors. According to a preferred embodiment of the present invention the device for discharging the energy storage cell 12 is located within the housing 6 of the battery 3. In an alternative embodiment of the present invention it is also possible that a single or additional device for discharging the energy storage cell is located within the housing 6 of the power tool 3.

Beyond that, the device for discharging the energy storage cell 12 is connected to the controlling device 9, in order to transfer and receive signals and data.

Also, the system 1 also comprises a temperature sensor 13 for measuring temperature, i.e. temperature values, inside the battery. Whereby, the at least one temperature sensor is positioned within a housing 6 of the battery 3. It is, however, also possible that an additional temperature sensor or a single temperature sensor is positioned within a housing 7 of the power tool 2. FIG. 1 illustrates a system 1 with the temperature sensor 13 within the housing 6 of the battery 3. The temperature sensor 13 serves to measure and record temperature, i.e. temperature values, inside the battery 3. Also, the temperature sensor 13 is connected to the controlling device 9, in order to transfer and receive signals and data.

In addition to that, the system 1 comprises a signal transmitter 14 for sending out signals. As shown FIG. 1, the signal transmitter 14 is in form of a multi-colored LED-light. The LED-light is able to emit three colors, i.e. red, yellow or green. The color code represents a critical condition for the system (=red light), a warning for the system (=yellow light) or an uncritical condition for the system (=green light).

According to an alternative embodiment of the present invention, the system 1 also comprises a strain gauge 15. It is possible that the system 1 comprises more than one strain gauge. At least one strain gauge 15 is positioned within the housing 6 of the battery 3. It is, however, also possible that an additional strain gauge or a single strain gauge is positioned within a housing 7 of the power tool 2. FIG. 1 illustrates a system 1 with strain gauge 15 within the housing 6 of the battery 3. The strain gauge 15 serves to measure and record strain on the battery 3. Also, the strain gauge 15 is connected to the controlling device 9, in order to transfer and receive signals and data.

According to an alternative embodiment of the present invention, the system 1 also comprises a piezoelectric sensor 16. It is possible that the system 1 comprises more than one piezoelectric sensor 16. At least one piezoelectric sensor 16 is positioned within the housing 6 of the battery 3. It is, however, also possible that an additional piezoelectric sensor or a single piezoelectric sensor is positioned within a housing 7 of the power tool 2. FIG. 1 illustrates a system with piezoelectric sensor 16 within the housing 6 of the battery 3. The piezoelectric sensor 16 serves to measure and record strain on the battery 3. Also, the piezoelectric sensor 16 is connected to the controlling device 9, in order to transfer and receive signals and data.

All the sensors, i.e. the acceleration sensor 10, piezoelectric sensor 16, temperature sensor 13 as well as the device for measuring a voltage 11 are frequently measuring and recording the condition of the system 1 in terms of detected values and parameters. Subject to the detected values, it is possible to interpret the events causing the detected values and consequently to categorize the effects these events are having on the system 1.

The system 1 is able to identify stress, abuse or any other form of improper handling of the system 1 or parts of the system by just one effect or several effects in combination.

According to that, if the acceleration sensor 10 is detecting certain acceleration values within a certain range and for a certain time period, the system 1 is able to identify that the system 1 is subject to vibrations. If the acceleration values detected by the acceleration sensor 10 exceed a first predetermined threshold value for a first predetermined time period, a first signal is send out by the signal transmitter 14. This first signal indicates to a user of the system 1 that the system 1 is in fact to experiencing some vibrations and that the currently detected vibrations are not yet harmful to the system 1 or battery 3.

However, if the acceleration values detected by the acceleration sensor 10 exceed a second predetermined threshold value for a first or second predetermined time period, a second signal is send out by the signal transmitter 14. A second signal will also be transmitted by the signal transmitter 14, if the acceleration values detected by the acceleration sensor 10 exceed the first predetermined threshold value for a second predetermined time period. It has to be understood that the second threshold value is higher than the first threshold value. Also, the second time period is longer than the first time period. The second signal indicates to a user of the system 1 that the system 1 is in fact to experiencing serious vibrations and, if the vibrations would continue in this form, harm could be done to the system or battery.

Yet, if the acceleration values detected by the acceleration sensor 10 exceed a third predetermined threshold value for a first, second or third predetermined time period, a third signal is send out by the signal transmitter 14. It has to be understood that the third threshold value is higher than the first or second threshold value. Also, the third time period is longer than the first or second time period. The third signal indicates to a user of the system 1 that the system 1 is experiencing critical (i.e. not acceptable) vibrations and harm is done to the system 1 or battery.

So, even if relative low vibrations, i.e. in terms of exceeding just the first threshold value, were occurring to the system 1, but the time period was longer than the always acceptable first time period, i.e. in terms of exceeding the second or third time, the system 1 would suffer critical vibrations and consequently warn the user by sending out the second or even third signal.

In the case the system 1 is dropped from a certain height to the ground, the accelerometer 10 will measure a value of about zero in X-Y and Z-direction, as the system 1 will be in free fall. Due to measuring uncertainty or measuring errors the measured value of the accelerometer 10 would be in the range of −0,1 g and +0,1 g. Any reading within this range would identify the system 1 as free falling.

When the system 1 eventually reaches the ground, i.e. moment of impact on the ground, the accelerometer 10 measures a relative high acceleration value in at least one of the X-Y or Z-direction. As shown within the graph of FIG. 4, the acceleration value can be as high as 350 g. The unit g represents gravitational force, i.e. 1 g equals 9,81 m/s2. The reading of the accelerometer 10 can be as high as 5000 g in any of the X-Y and Z-direction at the moment of impact. A first predetermined threshold value for the accelerometer 10 lies between 200 g and 5000 g and determines an impact of the system 1 on a ground (i.e. floor). The first predetermined threshold value for the accelerometer 10 is saved (i.e. stored) within a memory of the controlling device 9.

Beyond that, a second predetermined threshold value for the accelerometer 10 determines if an impact was critical for the system 1 or battery 3. The second predetermined threshold value for the accelerometer 10 lies above 350 g.

The time from the start of the free fall of the system 1, i.e. nearly zero measurement of the accelerometer 10, to the moment of impact is recorded by the clock within the controlling device 9. By measuring the time for the system 1 to travel, i.e. fall or drop, to the ground the distance, i.e. drop height, can be calculated by means of the equation:

$$distance = 0{,}5 \times (acceleration\ value) \times (time^2).$$

If the distance (i.e. drop height) is greater than 2 m (i.e. meter), the drop on a hard, non-elastic ground can, in general, be considered critical for the system 1. A first predetermined threshold value for the distance (i.e. drop height) is 1 m. A second predetermined threshold value for the distance (i.e. drop height) is 1,5 m and a third predetermined threshold value for the distance (i.e. drop height) is 2 m. The first, second and third predetermined threshold values can differ depending on the actual weight and complexity of the system. With other words: the heavier the system 1, the lower the threshold values.

If the distance (i.e. drop height) detected by the acceleration sensor 10 exceed a first predetermined threshold value, a first signal is send out by the signal transmitter 14. This first signal indicates to a user of the system 1 that the system 1 is in fact to experiencing a drop not yet harmful to the system 1 or battery 3.

However, if the distance (i.e. drop height) detected by the acceleration sensor 10 exceed a second predetermined threshold value, a second signal is send out by the signal transmitter 14. This second signal indicates to a user of the system 1 that the drop is potentially harmful and could have caused damage to the system 1 or battery 3.

Yet, if the drop detected by the acceleration sensor 10 exceed a third predetermined threshold value, a third signal is send out by the signal transmitter 14. It has to be understood that the third threshold value is higher than the first or second threshold value. The third signal indicates to a user of the system 1 that the drop was critical (i.e. not acceptable) and harm is done to the system 1 or battery 3. Damage to the system 1 or battery 3 cannot be ruled out.

The piezoelectric sensor 16 or/and the acceleration sensor 10 of the system 1 is able to detect a shock occurring to the system 1 or battery 3. Due to its abilities the piezoelectric sensor 16 is thereby able to detect shock occurring to the system 1, even if the system is not moving, i.e. stationary. Depending on the magnitude of the shock, damage could occur to the system 1 or battery 3. If a shock measurement done by the piezoelectric sensor 16 or/and the acceleration sensor 10 is exceeding a first threshold value a first signal is send out by the signal transmitter 14. Also, if a shock measurement done by the piezoelectric sensor 16 or/and the acceleration sensor 10 is exceeding a second threshold value a second signal is send out by the signal transmitter 14. Beyond that, if a shock measurement done by the piezoelectric sensor 16 or/and the acceleration sensor 10 is exceeding a third threshold value a third signal is send out by the signal transmitter 14. The third threshold value is greater than the second threshold value and the second threshold value is again greater than the first threshold value. If the first signal is send out by the signal transmitter 14, the shock occurring to the system 1 and battery 3 is not harmful yet. The second signal is, however, indicating that some harm could have been done to the system 1 and battery 3 by the shock and the user of the system 1 should be aware that one or more functionalities of the system 1 could fail. The third signal is warning the user of the system 1 that harm has been done to the system 1 and that the system 1 should be inspected.

The device for measuring a voltage 11 s positioned within the housing 6 of the battery 3 and is measuring the voltage of each of the battery cells 8. The device for measuring a voltage 11 is connected to the controlling device 9 and the measurement of the voltage is transferred to the controlling device 9. The device for measuring a voltage 11 is measuring a first and second voltage value. If a difference value between the first and second voltage value is greater than a certain predetermined threshold value, it can be assumed that the battery 3 is not functioning normally and is potentially damaged. The difference between the first and second detected voltage value could be about 0,1 Volt and should have occurred within 60 seconds. A predetermined threshold value for the difference value is 0,1 Volt and a predetermined threshold value for the time is 60 seconds. With other words: if a voltage difference of at least 0,1 Volt and within a maximum duration of 60 seconds occurs, a critical situation could have happened to the system 1.

In this context, if the difference value between the first and second voltage value is greater than a first threshold predetermined value, a first signal is send out by the signal transmitter 14. The first signal is indicating to the user of the system 1 that some voltage is lost. The amount is, however, not considered as an indication of a severe problem. If the difference value between the first and second voltage value is greater than a second threshold predetermined value, a second signal is send out by the signal transmitter 14. The second signal is indicating to the user of the system 1 that a significant amount of voltage is lost and some damage has been to the system 1. If the difference value between the first and second voltage value is greater than a third threshold predetermined value, a third signal is send out by the signal transmitter 14. The third signal is indicating to the user of the system 1 that a severe amount of voltage is lost and great damage has been to the system 1. It has to be understood that the third threshold value is greater than the second threshold value and that the second threshold value is again greater than the first threshold value.

As the accelerometer 10 is configured to measure acceleration values (i.e. G-force values) in all three X-Y and Z-direction of the system 1, the orientation of the system 1 at the moment of impact can be determined.

By means of the look-up table as well as the magnitude and plus- or minus-sign of the individual acceleration values the actual point of impact of the system 1 can be determined. So, for example, a high magnitude and negative reading (i.e. minus sign) of the acceleration value (i.e. G-force) in the X-direction mean that the left-hand-side of the housing of the battery 3 is contacting the ground at the moment of impact. A high magnitude and positive reading (i.e. plus sign) of the acceleration value (i.e. G-force) in the Y-direction means that the back-side of the housing of battery 3 is contacting the ground at the moment of impact. And, a high magnitude and positive reading (i.e. plus sign) of the acceleration value (i.e. G-force) in the Z-direction means that the bottom of the housing 6 of the battery 3 is contacting the ground at the moment of impact. FIG. 6 shows a case, in which the battery 3 is impacting into the ground after a fall. With the help of the individual acceleration values in the X-Y and Z-direction it can be determined that the battery 3 is orientated (i.e. tilted) to the left-hand side, bottom and back-side of the housing 6 of the battery 3 at the moment of impact. By determining the orientation of the housing 6 of the battery 3 the orientation of the entire system 1 can also be determined. Determining the orientation of the entire system 1 at the moment of impact can be calculated by regarding the exterior dimension of the housing 7 of the power tool 2 as well as the exterior dimension of the housing 6 of the battery 3.

In this context, a high magnitude of an acceleration value means at least 50% of a maximum detectable acceleration value.

The location of the center of gravity CG of the system 1 is stored in and can be provided by the controlling device 9. By connecting a power tool 2 with a battery 3 certain data and information are exchanged via an interface (i.e. connecting device) between the power tool 2 and battery 3. The location of the center of gravity CG is an example of the data and information.

By determining the orientation of the system 1 at the moment of impact and considering the location of the center of gravity CG of the system 1 a horizontal distance HD can be determined (i.e. calculated) between the actual location of impact LI and the center of gravity CG. The shorter the horizontal distance HD between the actual location of impact LI and the center of gravity CG, the closer the center of gravity CG is above the location of impact LI of the housing 6 of the battery 3. A predetermined threshold value for the horizontal distance HD is about 50 mm. If a determined horizontal distance HD is less than the threshold value of 50 mm, the drop happened to the system 1 is considered critical. If the center of gravity CG is, for example, directly, i.e. in a vertical line, above the location of impact LI, most of the weight of the system 1 is falling and thereby acting on the location of impact. The more weight is acting on the location of impact, the larger the damages that could be caused to the system 1. The information about the location of the center of gravity CG of the system 1 is can be determined by means of loo-up tables. When connecting the battery 3 with the power tool 2 information and data are being transferred via an interface between the battery 3 and the power tool 2. The information and data serve to identify the type of battery 3 and the type of power tool 2. They also serve to check compatibility between the two components. The identification data of the battery 3 and power tool 2 is transmitted to the memory of the controlling device 9. By means of a pre-stored look-up table the center of gravity CG of the specific combination of battery 3 and power tool 2 (i.e. system) is available. The actual location of the center of gravity CG is represented by coordination data in reference to the housing 7 of the system 1. The housing 7 of the system 2 comprises the housing 6 of the battery 3 as well as the housing 7 of the power tool 2. The housing can also be termed case or casing.

After an impact, i.e. drop of the system 1, the detected data and information of the actual location of impact LI, the horizontal distance HD between the center of gravity CG and location of impact LI, the drop height H, the detected difference between a first and second voltage value of the battery 3, the actual acceleration values in the X-Y and Z-direction are transferred to the controlling device 9.

The device for discharging the battery 12 is discharging the battery (i.e. the cells 8), if the traveling distance (=drop height H) exceeds a predetermined threshold value, the at least one acceleration value in the X, Y and Z direction exceeds a second predetermined threshold value (max value at impact); the horizontal distance HD is below a predetermined threshold value, the (three) acceleration values in the X, Y and Z direction equal predetermined values and the detected voltage value of the at least one energy storage cell 8 is less than a predetermined threshold value.

The invention claimed is:

1. A method for controlling a system having a power tool, at least one battery having at least one energy storage cell, at least one acceleration sensor for detecting at least one acceleration value in an X, Y and Z direction, at least one piezoelectric sensor, a controller, signal transmitter and a measurer for measuring a voltage, the method comprising the steps of:
    determining vibration values acting upon the system by detecting acceleration values within a predetermined range;
    determining a free-fall state of the system by detecting an acceleration value in the X, Y and Z direction being equal to a predetermined range;
    determining an impact of the system by detecting at least one acceleration value in the X, Y and Z direction exceeding a first predetermined threshold value;
    determining a traveling distance between the detecting the acceleration value in the X, Y and Z direction being equal to the predetermined range and the detecting the at least one acceleration value in the X, Y and Z direction exceeding the first predetermined threshold value;
    determining a shock value via the at least one piezoelectric sensor or the at least one acceleration sensor;
    detecting a first and second voltage values of the at least one energy storage cell via the measurer for measuring the voltage; and
    sending out a first signal via the signal transmitter if the acceleration values within the predetermined range for determining vibrations exceed the first predetermined threshold value for a first predetermined time period, a determined drop height exceeds a further predetermined threshold value, the determined shock value for determining a shock exceeds a yet further predetermined threshold value or a difference value between the first and second voltage values exceeds a still yet further predetermined threshold value.

2. The method as recited in claim 1 further comprising sending out a second signal via the signal transmitter if the acceleration values within the predetermined range for determining vibrations exceed a second predetermined threshold value for a second predetermined time period, the determined drop height exceeds a second further predetermined threshold value, the determined shock value for determining a shock exceeds a second yet further predetermined threshold value or a difference value between the first and second voltage values exceeds a second still yet further predetermined threshold value.

3. The method as recited in claim 2 further comprising sending out a third signal via the signal transmitter if the acceleration values within the predetermined range for determining vibrations exceed a third predetermined threshold value for a third predetermined time period, the determined drop height exceeds a third further predetermined threshold value, the determined shock value for determining a shock exceeds a third yet further predetermined threshold value or a difference value between the first and second voltage values exceeds a third still yet further predetermined threshold value.

4. The method as recited in claim 3 further comprising sending out a fourth signal via the signal transmitter, if an occurrence of an event in which at least one acceleration value exceeds the first predetermined threshold value, exceeds a predetermined quantity during a fourth predetermined time period.

5. A system for carrying out the method as recited in claim 1 and comprising the power tool, the at least one battery, the at least one acceleration sensor, the controller, and an interface for an exchange of data between the at least one battery, the at least one piezoelectric sensor, the signal transmitter and the power tool, and the measurer.

6. The system as recited in claim 5 further comprising at least one temperature sensor for measuring a temperature inside the battery.

* * * * *